United States Patent [19]

Leung et al.

[11] Patent Number: 5,008,568
[45] Date of Patent: Apr. 16, 1991

[54] CMOS OUTPUT DRIVER

[75] Inventors: Wingyu Leung, Cupertino; Chuen-Der Lien, Mountain View, both of Calif.

[73] Assignee: Integrated Device Technology, Inc., Santa Clara, Calif.

[21] Appl. No.: 565,169

[22] Filed: Aug. 8, 1990

Related U.S. Application Data

[63] Continuation of Ser. No. 300,915, Jan. 24, 1989, abandoned.

[51] Int. Cl.[5] .......................................... H03K 19/003
[52] U.S. Cl. .................................... 307/451; 307/443; 307/263; 307/270; 307/475
[58] Field of Search ............... 307/443, 451, 572, 585, 307/263, 270, 262, 542, 542.1

[56] References Cited

U.S. PATENT DOCUMENTS

| | | | |
|---|---|---|---|
| 4,622,482 | 11/1986 | Ganger | 307/263 |
| 4,638,187 | 1/1987 | Boler et al. | 307/585 |
| 4,737,667 | 4/1988 | Tihanyi | 307/451 |
| 4,777,389 | 10/1988 | Wu et al. | 307/448 |
| 4,785,201 | 11/1988 | Martinez | 307/585 |
| 4,906,867 | 3/1990 | Petty | 307/451 |

Primary Examiner—Timothy P. Callahan
Attorney, Agent, or Firm—Thomas E. Schatzel

[57] ABSTRACT

A transistor configured as a capacitor is connected between the gate and drain of an output, pull-down transistor to limit the rate of change (di/dt) of the current conducted through the pull-down transistor during the turn-on of the transistor to limit ground bounce (transients). Drive for the pull-down transistor is provided, in part, by a NOR gate, the transistors of which are sized to provide a finite resistive to the pull-down transistor. Additional drive for the pull-down transistor is provided by a transistor connected to function as a resistive pull-up between the gate and the drain of the pull-down transistor.

6 Claims, 2 Drawing Sheets

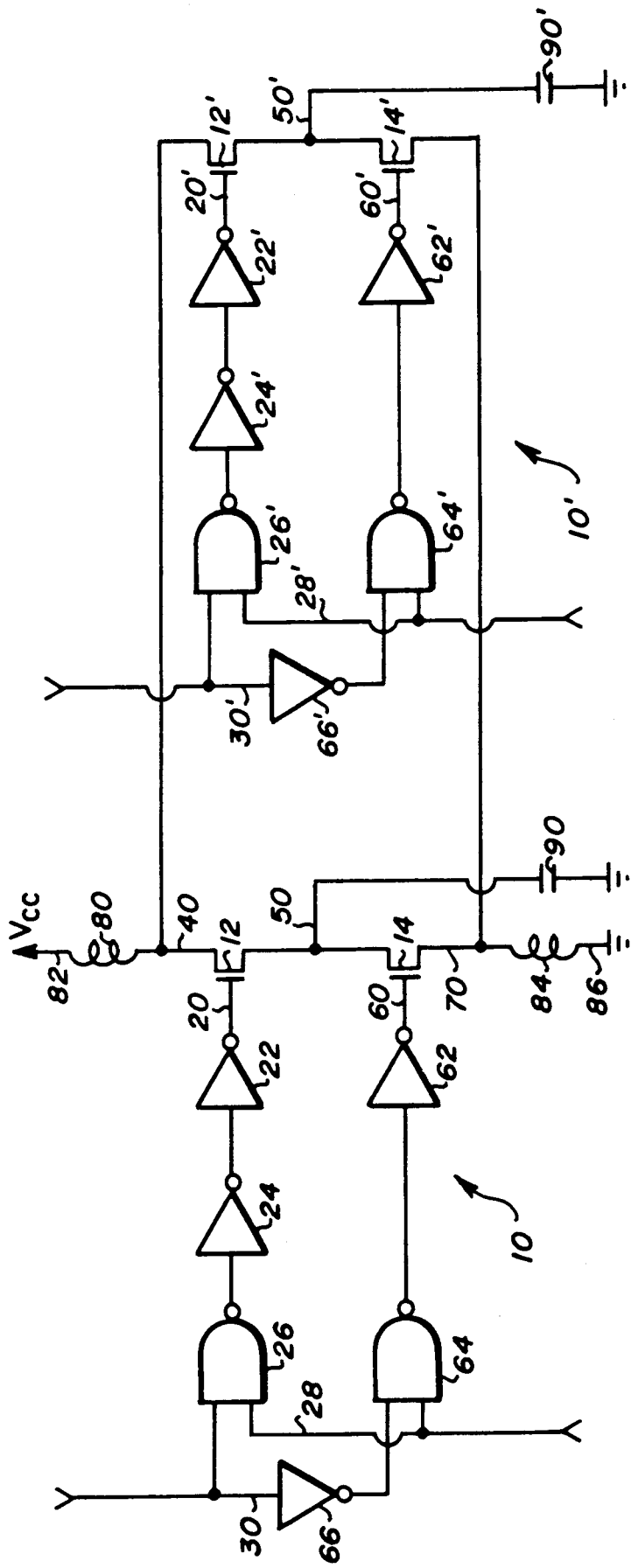
Fig_1 (PRIOR ART)

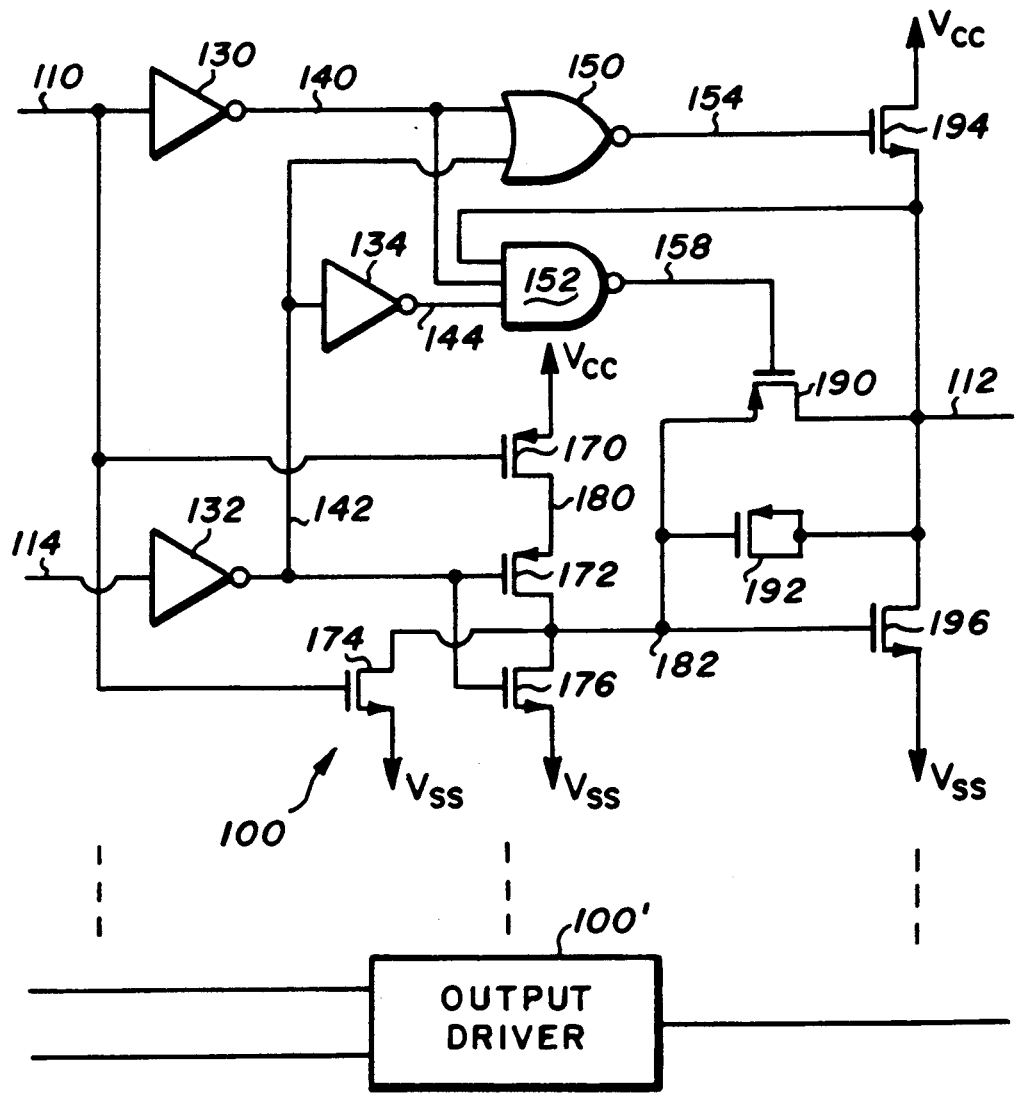
Fig_2

CMOS OUTPUT DRIVER

This is a continuation of copending application Ser. No. 07/300,915 filed on Jan. 24, 1989, now abandoned.

TECHNICAL FIELD

The present invention relates to integrated circuit devices generally and more particularly to an output driver having improved transient suppression.

BACKGROUND ART

A transient (spike or bounce) problem has been associated with certain high speed, high drive, CMOS, integrated circuit type output drivers (buffers). More specifically, when the state of an output driver is switched, transients are developed across stray inductances in the driver ground (Vss) and power (Vcc) paths. These transients are coupled to the outputs of other output drivers which share the same ground and power paths.

For example, consider the pair of prior art type output drivers illustrated in FIG. 1 of the drawing generally designated by the numbers 10 (on the left side of the drawing) and 10' (on the right), respectively. Buffer 10 is shown to employ a P-channel, field-effect transistor (FET), which is designated 12 (in the center of the drawing), and an N-channel, field-effect transistor, designated 14. Transistors 12 and 14 are connected as a CMOS inverter in what is referred to herein as a (P-channel over N-channel) totem-pole configuration. More specifically, transistor 12 is configured in a CMOS, pull-up configuration in which the gate of the transistor (12) is coupled by a line 20 and a pair of inverters 22 and 24 to the output of a 2-input NAND gate 26. The inputs of gate 26 are connected, one to a line 28 to receive a driver 10 enabling signal and the other to a line 30 to receive a data input signal. The (end of the channel referred to herein as the) source of transistor 12 is connected to a line 40., and, the (other end of the channel, referred to herein as the) drain of the transistor (12) is connected to a line 50, upon which driver 10 develops a data output signal.

Transistor 14 is configured in a CMOS, pull-down configuration in which the gate of transistor 14 is coupled by a line 60 and another inverter 62 to the output of another 2-input NAND gate 64. One of the inputs of gate 64 is coupled by still another inverter 66 to line 30; and, the other input of the gate is connected to line 28. The drain of transistor 14 is connected to line 50; and, the source of the transistor is connected to a line 70.

Output driver 10' is similar to output driver 10. (For clarity, in the drawing, corresponding parts are similarly numbered, the driver 10' part numbers additionally having a prime.)

The sources of transistors 12 and 12' are directly connected to receive a power supply potential (Vcc); and, the sources of transistors 14 and 14' are directly connected to receive a circuit ground potential (Vss). However, there are stray inductances associated with the connections, attributable, in part, to the chip metalization, to the wire bonding, and to the lead frame. (The stray inductances pose a particular problem with devices which are of the series that is commonly designated 7400 and which are packaged in dual in-line packages (DIPs) in which the ground and power pins are located at the extreme ends of the package.)

For purposes of illustration, the stray inductances are represented by discrete inductors. Thus, in the drawing, line 40 is shown coupled by an inductor 80 (representing the stray inductances in the power path) to a line 82 to receive the power supply potential; and, line 70 is shown coupled by an inductor 84 (representing the stray inductances in the ground path) to a line 86 to receive the circuit ground potential.

The capacitive reactance of the output driver 10 load is represented in the drawing by a discrete capacitor 90 connected between lines 50 and 86.

In understanding the transient problem, first, assume that output driver 10 is in the state in which transistor 12 is "on" and transistor 14 is "off". In this state, a "high" logic level potential is developed on line 50 and across capacitor 90. Also, assume that output driver 10' is in the state in which transistor 12' is "off" and transistor 14' is "on" developing a "low" logic level potential on line 50'.

Next, assume that the state of output driver 10 is switched so as to turn transistor 12 "off" and transistor 14 "on". When transistor 14 is turned "on", the potential developed across capacitor 90 is coupled by transistor 14 across inductor 84. As a consequence, a transient (ground bounce) is developed across inductor 84. Since transistor 14' (of output driver 10') is "on", the transient is coupled by transistor 14' to line 50'. (A similar transient is developed on line 50' when output driver 10' is held in the state in which transistor 12' is "on" and transistor 14' is "off" while the state of output driver 10 is switched so as turn transistor 14 "off" and transistor 12 "on".)

The transient problem is primarily associated with high speed, high drive, CMOS, integrated circuit type output devices. With those devices of the 7400 series that are designated 74XXX, 74HXXX, 74SXXX, and 74LSXXX, the transient turns "off" the bipolar transistor equivalent of (FET) transistor 14' before the (bipolar) transistor couples an appreciable amount of the transient to the output of the output driver. Also, with those devices of the 7400 series that are designated 74HCXXX and 74HCTXXX, the equivalent of transistors 12 and 14 and their drivers are not strong enough to develop an appreciable transient level across the equivalent of inductors 80 and 84. However, as the transistor channel length is decreased (to less than two microns (one millionth of a meter)) and the transistor channel width is increased, a transient of appreciable level is developed across the equivalent of inductor 84 and coupled to the equivalent of line 50'. A transient having a rise time of less than one nanosecond and a level in excess of three volts has been observed across the equivalent of inductor 84 when seven of eight output drivers (of an octal driver) are simultaneously switched.

For additional information on the transient problem, the reader is directed to the U.S. Pat. No. 4,785,201 of Marcelo A. Martinez, the articles which appeared on pages 29 and 30 of the Aug. 7, 1986 issue and on pages 81 and 82 of the Sept. 18, 1986 issue of -Electronics- and which were cited in the patent, pages 709, 729–730, and 744–745 of the -IEEE Journal of Solid-State Circuits-, vol. sc-22, no. 5, Oct., 1987, and pages 88–89 and 120–123 of the -Digest of Technical Papers- IEEE International Solid-State Circuits Conference, Feb. 17–18, 1988, 0193-6530/88/00000XXX$01.00.

DISCLOSURE OF THE INVENTION

It is therefore the primary object of the present invention to provide a high speed, high drive, CMOS, integrated circuit type output driver having improved transient suppression.

Another object of the present invention is to provide a transient suppressed, high speed, high drive, CMOS, integrated circuit type output driver compatible with the 7400 series devices (that are packaged in dual in-line packages in which the ground and power pins are located at the extreme ends of the package).

Another object of the present invention is to provide a simple, transient suppressed, high speed, high drive, CMOS, integrated circuit type output driver.

Briefly, the presently preferred embodiment of an output driver in accordance with the present invention includes a transistor (192) configured as a capacitor connected between the gate and drain of an output, pull-down transistor (196) to limit the rate of change (di/dt) of the current conducted through the pull-down transistor during the turn-on of the transistor to limit ground bounce (transients). Drive for the pull-down transistor is provided, in part, by a NOR gate, the transistors of which (170 and 172) are sized to present a finite resistance to the pull-down transistor (196). Additional drive for the pull-down transistor is provided by a transistor (190) connected to function as a resistive pull-up between the gate and the drain of the pull-down transistor.

These and other objects of the present invention will no doubt become apparent to those skilled in the art after having read the detailed description of the presently preferred embodiment of the present invention which is illustrated in the figures of the drawing.

BRIEF DESCRIPTION OF THE FIGURES IN THE DRAWING

FIG. 1 is a schematic diagram of a pair of prior art type output drivers; and

FIG. 2 is a schematic diagram of a CMOS output driver in accordance with the presently preferred embodiment of the present invention.

BEST MODE FOR CARRYING OUT THE INVENTION

Illustrated in FIG. 2 of the drawing generally designated by the number 100 is the presently preferred embodiment of a CMOS output driver in accordance with the present invention. Responsive to the logic level of a signal externally developed on a data input line, which is designated 110, driver 100 is operative to develop a signal of inverted logic level on a data output line, which is designated 112, when a high logic level signal is externally developed on an output enable line, which is designated 114. Driver 100 is shown to include three, similar, inverters, which are respectively designated 130, 132, and 134. Each of the inverters (130, 132, and 134) employs a P-channel, field-effect transistor (FET) (which, for clarity, is not shown) and an N-channel, field-effect transistor (also not shown), the transistors being connected in the CMOS, inverter, (P-channel over N-channel) totem-pole configuration, with the transistor gates connected together. To invert the logic level of a signal externally developed on data input line 110, inverter 130 is configured with the inverter data input (transistor gates) connected to the data input line (110) and the inverter data output (transistor drains) connected to a line 140. Inverter 132 is configured with the inverter data input connected to output enable line 114 and the inverter data output connected to a line 142, to invert the logic level of a signal externally developed on the output enable line (114). Finally, to invert the logic level of a signal developed on line 142 by inverter 132, inverter 134 is configured with the inverter data input connected to line 142 and the inverter data output connected to a line 144.

Further, driver 100 includes a 2-input NOR gate, which is designated 150, and a 3-input NAND gate, which is designated 152. Gate 150 is configured to gate together the inverted data input signal developed by inverter 130 on line 140 with the inverted output enable signal developed by inverter 132 on line 142 to develop a signal on a line 154. For this purpose, gate 150 employs two P-channel, field-effect transistors (not shown) and two N-channel, field-effect transistor (also not shown), the transistors being connected in a CMOS, NOR, gate configuration (which is discussed below). Gate 152 is configured to gate together a signal developed on line 112, the inverted data input signal developed by inverter 130 on line 140, and the twice inverted output enable signal developed by inverter 134 on line 144 to develop a signal on a line 158. For this purpose, gate 152 employs a P-channel, field-effect transistor (not shown) and an N-channel, field-effect transistor (also not shown). The transistors are connected in the CMOS, (P-channel over N-channel) totem-pole configuration. Gate 152 also includes two, additional, N-channel, field-effect transistor (not shown). The gate of the P-channel transistor is connected to receive a power supply potential (Vcc). The gate of the N-channel transistors are connected, one to line 112, another to line 140, and the third to line 144. The source of the P-channel transistor is connected to receive a power supply potential (Vcc). The source of each of the three N-channel transistors is connected to receive a circuit ground potential (Vss); and, the drain of each of the three N-channel transistors is connected to the drain of the P-channel transistor and to line 158.

In addition, driver 100 includes two P-channel, field-effect transistors, respectively designated 170 and 172, and two N-channel, field-effect transistors, respectively designated 174 and 176. Transistors 170, 172, and 176 are connected in the CMOS, NOR, gate configuration. More specifically, transistor 170 is configured, with the transistor gate connected to line 110, with the transistor source connected to receive a power supply potential (Vcc), and with the transistor drain connected to a line 180. Transistor 172 is configured, with the transistor gate connected to line 142, with the transistor source connected to line 180, and with the transistor drain connected to a line 182. The gate of transistor 176 is connected to the gate of transistor 172; the source of transistor 176 is connected to receive a circuit ground potential (Vss); and, the drain of transistor 176 is connected to the drain of transistor 172. Transistor 174 is configured, with the transistor gate connected to line 110, with the transistor source connected to receive a circuit ground potential (Vss), and with the transistor drain connected to line 182.

Finally, driver 100 includes two P-channel, field-effect transistors, respectively designated 190 and 192, and two N-channel, field-effect transistors, respectively designated 194 and 196. Transistor 190 is configured, with the transistor gate connected to line 158, with the transistor source connected to line 182, and with the transistor drain connected to line 112. Transistor 192, which is fabricated in an N-well, is configured as a capacitor, with the transistor gate connected to line 182 and with the transistor source and drain both connected to line 112. Transistor 194 is configured, with the transistor gate connected to line 154, with the transistor drain connected to receive a power supply potential (Vcc), and with the transistor source connected to line 112. Transistor 196 is configured, with the transistor gate connected to line 182, with the transistor source connected to receive a circuit ground potential (Vss), and with the transistor drain connected to line 112.

In the presently preferred embodiment, the field-effect transistors have the following parameters:

| Transistor | Type | Threshold Voltage | Channel Width | Channel Length |
|---|---|---|---|---|
| 130 | P-Channel | −0.7 Volts | 15 Microns | 0.9 Microns, |
| 130 | N-Channel | 0.7 Volts | 60 Microns | 0.8 Microns, |
| 132 | P-Channel | −0.7 Volts | 55 Microns | 0.9 Microns, |
| 132 | N-Channel | 0.7 Volts | 25 Microns | 0.8 Microns, |
| 134 | P-Channel | −0.7 Volts | 15 Microns | 0.9 Microns, |
| 134 | N-Channel | 0.7 Volts | 6 Microns | 0.8 Microns, |
| 150 | P-Channel | −0.7 Volts | 50 Microns | 0.9 Microns, |
| 150 | P-Channel | −0.7 Volts | 50 Microns | 0.9 Microns, |
| 150 | N-Channel | 0.7 Volts | 30 Microns | 0.8 Microns, |
| 152 | P-Channel | −0.7 Volts | 15 Microns | 0.9 Microns, |
| 152 | N-Channel | 0.7 Volts | 25 Microns | 0.8 Microns, |
| 152 | N-Channel | 0.7 Volts | 25 Microns | 0.8 Microns, |
| 152 | N-Channel | 0.7 Volts | 25 Microns | 0.8 Microns, |
| 170 | P-Channel | −0.7 Volts | 75 Microns | 0.9 Microns, |
| 172 | P-Channel | −0.7 Volts | 20 Microns | 1.2 Microns, |
| 174 | N-Channel | 0.7 Volts | 45 Microns | 0.8 Microns, |
| 176 | N-Channel | 0.7 Volts | 45 Microns | 0.8 Microns, |
| 190 | P-Channel | −0.7 Volts | 50 Microns | 1.2 Microns, |
| 192 | P-Channel | 1.5 Volts | 20 Microns | 20 Microns, |
| 194 | N-Channel | 0.7 Volts | 600 Microns | 0.8 Microns, and |
| 196 | N-Channel | 0.7 Volts | 1200 Microns | 0.8 Microns. |

For the proper operation of transistor (capacitor) 192, it is important that either transistor 170, transistor 172, or both be of suitable size such that the combination presents a finite resistance to transistor 196. When transistor 196 is being turned on, transistor 190 is turned on to provide a resistive pull-up driving transistor 196.

Output driver systems in accordance with the present invention employ eight, similar, CMOS output drivers, all integrated into a single device. The other CMOS output drivers are represented by an output driver 100'.

Operationally, when a low logic level signal is externally developed on output enable line 114, both transistors 194 and 196 are off (in a non-conductive state). When high logic level signals are externally developed both on data input line 110 and on output enable line 114, transistor 194 is turned on. When turned on, transistor 194 sources current into data output line 112, pulling-up the potential level developed on the line to a high logic signal level. When a low logic level signal is externally developed on data input line 110 and a high logic level signal is externally developed on output enable line 114, transistor 196 is turned on. When turned on, transistor 196 sinks current from data output line 112, pulling-down the potential level developed on the line to a low logic signal level.

To limit to an acceptable level ground bounce (transients) which occur when transistor 196 is turned on, the transistor (196) is turned on at, what is believed to be, an optimal rate. Returning for a moment to FIG. 1, it should be noted that the instantaneous level of the voltage developed across inductor 84 (the level of the ground bounce (transients), is, by definition, equal to the inductance (L) of the inductor (84) times the time rate of change of the current passing through (conducted by) the inductor (di/dt). Of course, any means by which the turn-on rate of the pertinent transistor (transistor 14 or 14' in FIG. 1 or transistor 196 in FIG. 2) is reduce reduces the level of the ground bounce (transients) developed across the inductor. The object, however, is to control the turn-on rate of the pertinent transistor so as to make the time rate of change of the inductor current (di/dt) a constant.

It is believed that transistor (capacitor) 192 (shown in FIG. 2) so controls the turn-on rate of transistor 196. More specifically, from the above relationship, it follows that, during turn-on, transistor 196 should be so controlled that the transistor (196) sinks a current, the level of which is equal to the maximum permissible level of the ground bounce voltage (Vb) divided by the inductor inductance (L), the quantity times t (time). However, transistor 196 sinks a current the level of which is proportional to the transistor (196) gate voltage (Vg). Thus, it follows that, optimally, during turn-on, the transistor 196 gate voltage (Vg) (drive) should be proportional to the square root of t (time).

During the period of time when transistor 196 is turned-on, it is believed that transistor (capacitor) 192 provides a feedback which establishes the transistor 196 gate voltage (Vg) at a level which is proportional to the square root of t as required. Because of the Miller effect, transistor (capacitor) 192 appears at the gate of transistor 196 as a capacitor, the capacitance (Cm) of which is equal to the capacitance of transistor (capacitor) 192 times the quantity one plus the product of the transconductance (Gm) of transistor 196 and the output driver output resistance (Ro). Since the transconductance (Gm) of transistor 196 is proportional to the transistor (196) gate voltage (Vg), it follows that the Miller effect capacitance (Cm) is, also, proportional to the transistor (196) gate voltage (Vg). However, the transistor 196 gate voltage (Vg) is equal to the transistor (196) gate current (Ig) divided by the Miller effect capacitance (Cm), the quantity times t (time) (when either transistor 170, transistor 172, or both are of suitable size such that the combination functions as a resistive pull-up). Since, as previously indicated, the Miller effect capacitance (Cm) is proportional to the transistor 196 gate voltage (Vg), it follows that the square of the transistor (196) gate voltage (Vg) is proportional to the transistor (196) gate current (Ig) times t (time). However, the transistor 196 gate current is relatively constant when the magnitude of the transistor (196) gate voltage (Vg) is less than the magnitude of the transistor 172 threshold voltage. As a consequence, (the Miller effect capacitance of) transistor (capacitor) 192 shapes the level of the transistor 196 gate voltage (Vg), such that the transistor (196) gate voltage (Vg) is a function of the square root of t (time) as required.

Again, for the proper operation of transistor (capacitor) 192, it is important that either transistor 70, transistor 172, or both be of suitable size such that the combination functions as a resistive pull-up. To provide suitable drive for transistor 196, transistor 190 is included. When transistor 196 is being turned on, transistor 190 is turned on to provide a resistive pull-up driving transistor 196. It is believed that the feedback provided by transistor (capacitor) 192 compensates for variations (from device to device) in the transconductance (Gm) of transistor 196.

It is contemplated that after having read the preceding disclosure, certain alterations and modifications of the present invention will no doubt become apparent to those skilled in the art. It is therefor intended that the following claims be interpreted to cover all such alterations and modifications as fall within the true spirit and scope of the invention.

What is claimed is:

1. An output driver (100) comprising in combination:
    an input line (110) for connection to receive an input signal;
    an output line (112);
    pull-down means including a transistor (196) having a gate, drain means connected to said output line, and source means connected to receive a power supply potential;
    capacitor means (192) connected between said pull-down means transistor drain means and said pull-down means transistor gate;
    first means (170, 172, 174, and 176) including at least an input connected to said input line and an output connected to said pull-down means transistor gate, said first means being responsive to at least the state of said input signal and operative to develop a signal of inverted state on said pull-down means transistor gate, said first means presenting a finite resistance to said pull-down means transistor gate;
    feedback means including a transistor (190) having a gate, source means connected to said pull-down means transistor gate, and drain means connected to said output line; and
    second means (130, 134, 150, and 152) including an input connected to said input line and an output connected to said feedback means transistor gate, said second means being responsive to at least the state of said input signal and operative to develop a signal of similar state on said feedback means transistor gate.

2. An output driver (100) comprising in combination:
    an input line (110) for connection to receive an input signal;
    an output line (112);
    pull-down means including a transistor (196) having a gate, drain means connected to said output line, and source means connected to receive a first power supply potential;
    capacitor means (192) connected between said pull-down means transistor drain means and said pull-down means transistor gate;
    first means (170, 172, 174, and 176) including at least an input connected to said input line and an output connected to said pull-down means transistor gate, said first means being responsive to at least the state of said input signal and operative to develop a signal of inverted state on said pull-down means transistor gate, said first means presenting a finite resistance to said pull-down means transistor gate;
    feedback means including a transistor (190) having a gate, source means connected to said pull-down means transistor gate, and drain means connected to said output line; and
    gate means (130, 134, 150, and 152) including a first input connected to said input line, a second input connected to said output line, and an output connected to said feedback means transistor gate, said gate means being responsive to at least the state of said input signal and the state of a signal developed on said output line and operative to develop on said feedback means transistor gate a signal the state of which is high except when both the state of the input signal is low and the state of said output line signal is high.

3. An output driver as recited in claim 2 further comprising pull-up means including a transistor (194) having a gate connected to said gate means, drain means connected to receive a second power supply potential, and source means connected to said output line, and wherein said gate means is further responsive to at least the state of said input signal and operative to develop a signal of similar state on said pull-up means transistor gate.

4. An output driver (100) comprising in combination:
    a first input line (110);
    a second input line (114);
    an output line (112);
    a first inverter (132) having an input connected to said second input line and an output;
    pull-down means including a transistor (196) having a gate, drain means connected to said output line, and source means connected to receive a first power supply potential;
    a first NOR gate (170, 172, 174, and 176) having a first input connected to said first input line, a second input connected to said first inverter output, and an output connected to said pull-down means transistor gate, said first NOR gate including first pull-up means employing a power supply line for connection to receive a second power supply potential, a first transistor (170) having a gate and a channel and a second transistor (172) having a gate and a channel connected in series with at least said first pull-up means first transistor channel between said first pull-up means power supply line and said pull-down means transistor gate, a predetermined one of said first pull-up means first and second transistor gates being connected to said first input line and the other one of said first pull-up means first and second transistor gates being connected to said first inverter output, said first pull-up means presenting a finite resistance to said pull-down means transistor gate; and
    capacitor means 192 connected between said pull-down means transistor drain means and said pull-down means transistor gate.

5. An output driver as recited in claim 4 further comprising:
    a second inverter (130) having an input connected to said first input line and an output;

a third inverter (134) having an input connected to said first inverter output and an output;

a NAND gate (152) having a first input connected to said output line, a second input connected to said second inverter output, a third input connected to said third inverter output, and an output; and feedback means including a transistor (190) having a gate connected to said NAND gate output, source means connected to said pull-down means transistor gate, and drain means connected to said output line.

6. An output driver as recited in claim 5 further comprising:

a second NOR gate (150) having a first input connected to said second inverter output, a second input connected to said first inverter output, and an output; and second pull-out means including a transistor (194) having a gate connected to said second NOR gate output, drain means connected to receive said second power supply potential, and source means connected to said output line.

* * * * *